United States Patent [19]
Chiozzi

[11] Patent Number: 6,137,364
[45] Date of Patent: Oct. 24, 2000

[54] LOW VOLTAGE DROP INTEGRATED ANALOG AMPLIFIER WITHOUT EXTERNAL COMPENSATION NETWORK

[75] Inventor: Giorgio Chiozzi, Cinisello Balsamo, Italy

[73] Assignee: STMicroelectronics S.r.l., Agrate Brianza, Italy

[21] Appl. No.: 09/236,800

[22] Filed: Jan. 25, 1999

[30] Foreign Application Priority Data

Jan. 29, 1998 [IT] Italy .................................. VA98A0003

[51] Int. Cl.[7] ...................................................... H03F 3/45
[52] U.S. Cl. .......................................... 330/255; 330/257
[58] Field of Search .................................. 330/252, 255, 330/257, 260, 288

[56] References Cited

U.S. PATENT DOCUMENTS

| | | | |
|---|---|---|---|
| 5,629,641 | 5/1997 | Cheng | 327/108 |
| 5,966,050 | 10/1999 | Yoshino et al. | 330/257 X |

*Primary Examiner*—Steven J. Mottola
*Attorney, Agent, or Firm*—Theodore E. Galanthay; Allen, Dyer, Doppelt, Milbrath & Gilchrist, P.A.

[57] ABSTRACT

An integrated amplifier includes a differential input stage including a first pair of bipolar junction transistors. A reference bias current generator biases the differential input stage with a reference bias current. A first and a second current mirror circuit drives a respective transistor of the first pair of bipolar junction transistors. Each of the first and second current mirror circuits includes a transistor having a base terminal connected to an intermediate node. An integrated resistor is connected to the intermediate node and is in series with the respective transistor of the first pair of bipolar junction transistors. The reference bias current of the differential input stage conducts through the integrated resistor. The reference bias current corresponds to a ratio between a base emitter junction voltage and a resistance of the integrated resistor. An output stage includes a second pair of bipolar junction transistors, which are controlled by a respective transistor of the first and second current mirror circuits.

16 Claims, 2 Drawing Sheets

LOW VOLTAGE DROP INTEGRATED ANALOG AMPLIFIER WITHOUT EXTERNAL COMPENSATION NETWORK

FIELD OF THE INVENTION

The present invention relates to the field of integrated circuits, and more particularly, to an integrated amplifier.

BACKGROUND OF THE INVENTION

In the field of audio circuits used in consumer goods such as radios, TV sets, voice recorders and the like, there has been an increasing demand for reducing costs by minimizing the silicon area requirement and number of discrete external components. At the same time, there has also been a concern about providing a sufficient amount of power, even at low supply voltages, as in the case of battery powered portable devices. Consequently, efforts have been directed towards simplification of audio amplifying stages for minimizing the occupied silicon area. In addition, efforts have been directed toward achieving satisfactory stability characteristics without requiring the use of external components, such as for example, RC compensation networks and the use of an output stage having the lowest voltage drop possible to maximize the power that may be delivered.

FIG. 1 shows a typical power amplifier used in audio devices. The output stage is formed with low voltage drop NPN transistors. Although the output stage is characterized by a relatively low voltage drop, the presence of two feedback loops, whose gain is difficult to control because they are tied to the maximum output current that may be delivered, requires the use of an external RC network to ensure adequate stability characteristics. Another integrated power amplifier that is widely used as an alternative to the structure of FIG. 1 is shown in FIG. 2. This amplifier is referred to as the OTA stage or amplifier, where OTA is an acronym for operational transconductance amplifier.

The amplifier in FIG. 2 is different from the amplifier of FIG. 1 because it uses a complementary pair of output transistors, Q1 and Q2. Another aspect which differentiates these two amplifiers is the way in which the quiescent bias current is fixed, i.e., the amplifier is idle. In this case, the biasing current is based upon the mirroring ratios in which the reference bias current $I_{ref}$ of the input differential stage is multiplied. The maximum current that may be delivered to the external load is therefore limited to the value given by the following expression:

$$I_{Max} \sim \beta_{1,2} I_{Ref}.$$

There exists a need for an integrated amplifier to provide a high maximum output current with a minimum voltage drop through the output stage of the amplifier. This is in addition to satisfying simplicity requirements such as limiting the silicon area need for integration and having sufficient intrinsic stability characteristics to eliminate the need for using compensating external networks.

SUMMARY OF THE INVENTION

It is an object of the present invention to provide an integrated amplifier particularly suited, though not exclusively, to audio applications that satisfies all the above noted requirements. These requirements often are in contrast with each other.

The simplicity and economy of integration are enhanced because the integrated amplifier of the invention may be formed with bipolar junctions transistors having a unique type of conductivity, with the exception of generating a reference bias current. A reduced number of components are also used to form integrated amplifier.

The integrated amplifier comprises a differential input stage including a first pair of bipolar junction transistors. A reference bias current generator biases the differential input stage with a reference bias current. A first and a second current mirror circuit drives a respective transistor of the first pair of bipolar junction transistors. Each of the first and second current mirror circuits includes a transistor having a base terminal connected to an intermediate node. An integrated resistor is connected to the intermediate node and is in series with the respective transistor of the first pair of bipolar junction transistors. The reference bias current of the differential input stage conducts through the integrated resistor. The reference bias current corresponds to a ratio between a base emitter junction voltage and a resistance of the integrated resistor. An output stage includes a second pair of bipolar junction transistors. The second pair of bipolar junction transistors are controlled by a respective transistor of the first and second current mirror circuits.

Each junction transistor of the first and second pair of bipolar junction transistors is an NPN transistor. Each transistor of the first and second current mirror circuits is a PNP transistor.

BRIEF DESCRIPTION OF THE DRAWINGS

The various aspects and advantages of the invention will become evident through the following description of an embodiment and by referring to the annexed drawings, wherein.

DETAILED DESCRIPTION OF THE PREFERRED EMBODIMENTS

Figure 1:
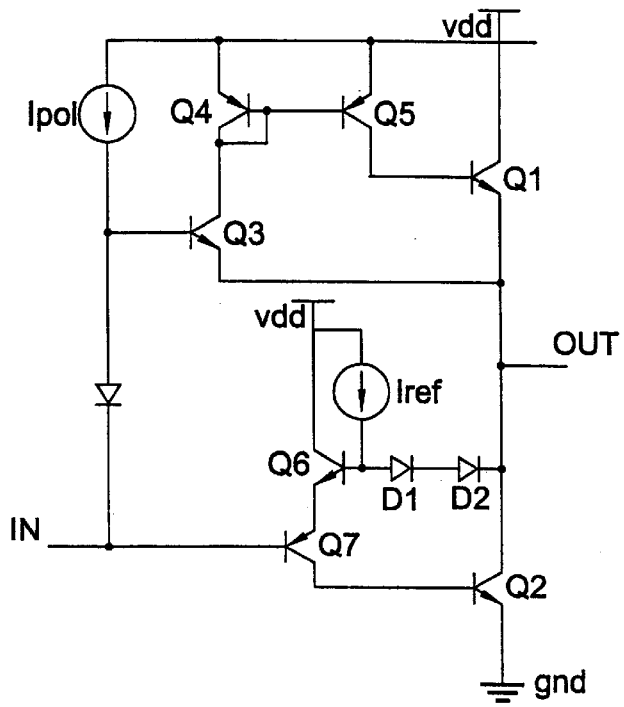
FIGS. 1 and 2 respectively show diagrams of integrated amplifiers according to the prior art.
Figure 2:
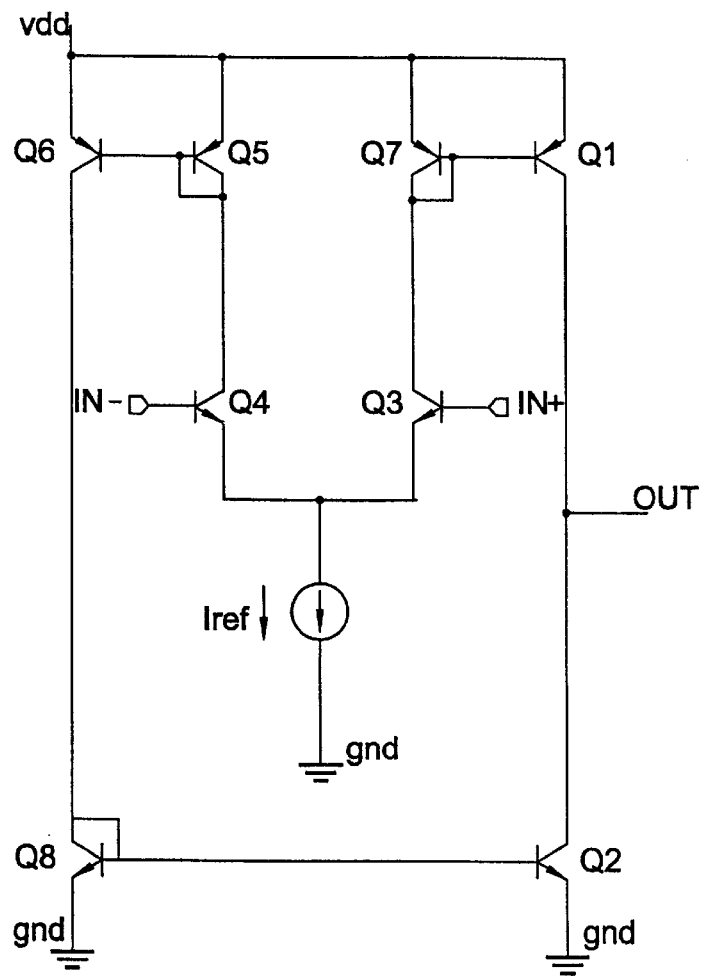
Figure 3:
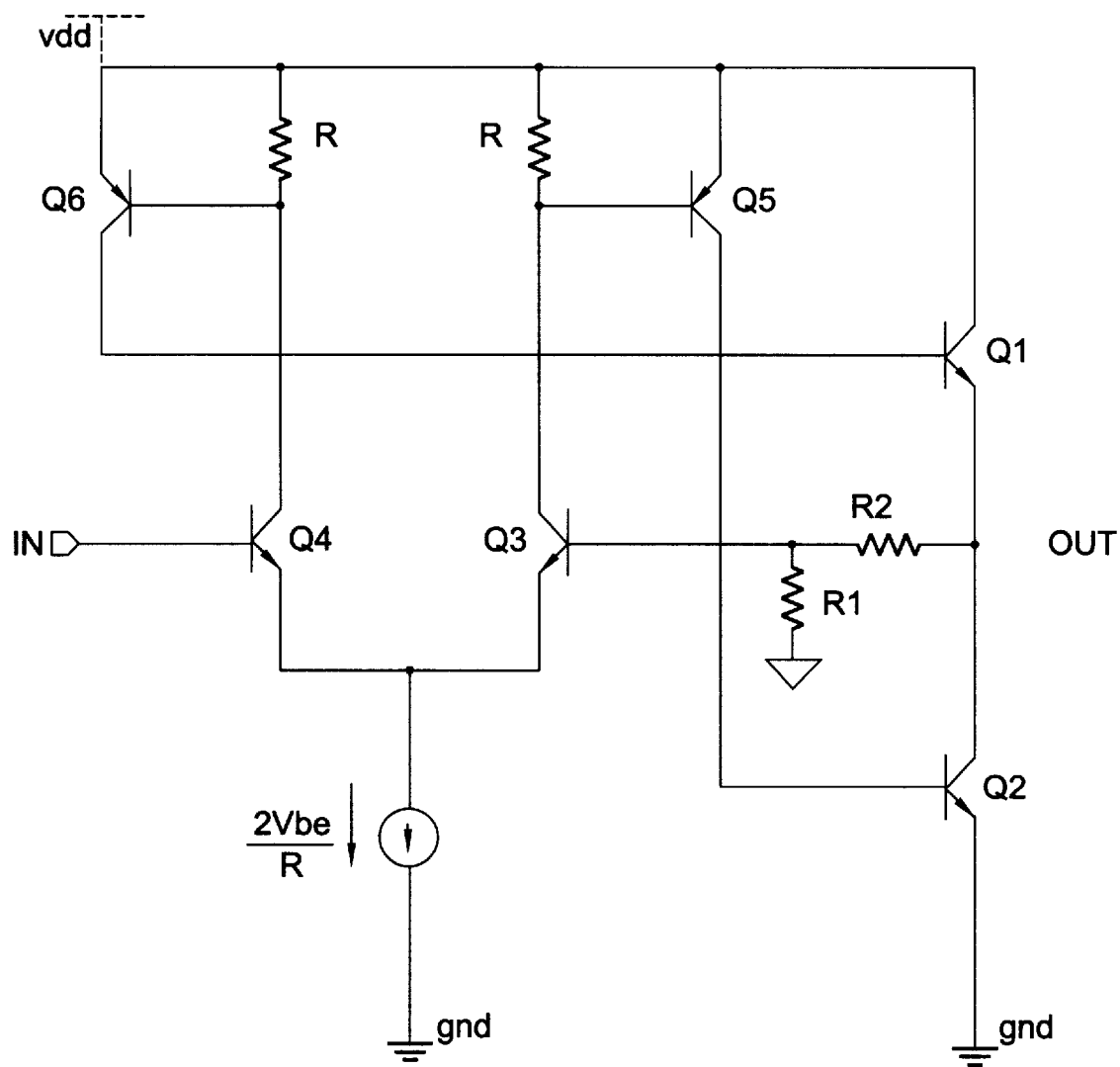
FIG. 3 shows a diagram of an integrated amplifier according to the present invention.

In the embodiment considered, the amplifier is formed with NPN bipolar junction transistors. When the amplifier is at a quiescent state, i.e., a rest condition, the reference current 2Vbe/R generated by a dedicated bias generator for an input differential stage determines the current delivered by the transistors Q5 and Q6. The base-emitter voltage (Vbe) used for generating the reference bias current of the differential input stage may be obtained, as shown, by biasing a PNP transistor of the same type as the Q5 and Q6 transistors. In this way, the current output by the power transistors Q1 and Q2 of the output stage of the amplifier will be given by the expression:

$$I_{Rep} = I_{ref} \beta_{pwr} \frac{A_{5'6}}{A_{ref}}$$

$I_{ref}$ is the reference bias current generated, for example, by biasing a PNP transistor. $A_{ref}$ is the area of the PNP transistor that generates the reference bias current. $A_{5,6}$ is the area of each of the transistors Q5 and Q6. $\beta_{pwr}$ is the current gain of the power transistors Q1 and Q2, whose maximum value may be limited by placing the diode-connected NPN transistors between the base and the emitter of the Q1 and Q2 transistors, according to a technique well known to one skilled in the art.

Because the input differential stage of the amplifier of the invention has a current equal to the ratio between a base emitter voltage (Vbe) and an integrated resistor R, a high gain is ensured between the bias current of the differential input stage, Q3 and Q4, and the maximum output current that may be delivered to a load by the amplifier.

Biasing of the differential input stage uses two resistors R of identical value that provides a rest voltage on the control terminals of the transistors Q5 and Q6. This functionally substitutes the diode-configured transistors commonly used in the prior art circuits as input devices for as many current mirror circuits of the current that controls the output stage of the amplifier.

The integrated amplifier circuit allows the signal current provided by one or the other of the two Q3 and Q4 transistors that form the differential input pair to flow, during a transient phase, into the base of the respective transistors Q5 or Q6. The signal current is the component in excess of the rest bias current of the differential input stage.

On a bottom half-wave during a transient, the differential stage comprised of the input pair of transistors Q3 and Q4 unbalances in a way that the current fed by Q5 increases until Q2 delivers the required current. On a top half-wave during a transient, the differential stage comprised of Q3 and Q4 unbalances in a way that the current fed by Q6 increases until Q1 delivers the required current.

The value of the maximum current that may be delivered is given by:

$$I_{Max} \sim \beta_{1,2}\, \beta_{5,6}\, \frac{Vbe_{ref}}{R}.$$

The gain established by the compensation resistors R1 and R2 ensures that the output voltage may drop to ground potential, thus limiting the loop gain. This ensures a stable operation even without using external RC compensation networks.

What is claimed is:

1. An integrated amplifier comprising:
    a differential input stage comprising a first pair of bipolar junction transistors;
    a reference bias current generator for biasing said differential input stage with a reference bias current;
    a first and a second current mirror circuit being driven by a respective transistor of said first pair of bipolar junction transistors, each of said first and second current mirror circuits comprising
        a transistor having a base terminal connected to an intermediate node, and
        an integrated resistor connected to the intermediate node and in series with the respective transistor of said first pair of bipolar junction transistors, the reference bias current for said differential input stage conducts through said integrated resistor, the reference bias current corresponds to a ratio between a base emitter junction voltage and a resistance of said integrated resistor; and
    an output stage comprising a second pair of bipolar junction transistors, said second pair of bipolar junction transistors being controlled by a respective transistor of said first and second current mirror circuits.

2. An integrated amplifier according to claim 1, wherein each transistor of said first and second pair of bipolar junction transistors comprises an NPN transistor.

3. An integrated amplifier according to claim 1, wherein each transistor of said first and second current mirror circuits comprises a PNP transistor.

4. An integrated amplifier according to claim 1, wherein the integrated resistors for said first and second current mirror circuits are substantially equal.

5. An integrated amplifier according to claim 1, further comprising:
    a compensation network comprising
        a first resistor having a first terminal connected to a base terminal of one of said first pair of bipolar junction transistors of said input stage and having a second terminal connected to a common node connecting said second pair of bipolar junction transistors together of said output stage, and
        a second resistor connected between the first terminal of said first: resistor and ground.

6. An integrated amplifier comprising:
    a differential input stage comprising a first pair of bipolar junction transistors;
    a reference bias current generator for biasing said differential input stage with a reference bias current;
    a first and a second current mirror circuit being driven by a respective transistor of said first pair of bipolar junction transistors, each of said first and second current mirror circuits comprising
        a transistor having a base terminal connected to an intermediate node, and
        an integrated resistor connected to the intermediate node and in series with the respective transistor of said first pair of bipolar junction transistors, the reference bias current for said differential input stage conducts through said integrated resistor; and
    an output stage comprising a second pair of bipolar junction transistors, said second pair of bipolar junction transistors being controlled by a respective transistor of said first and second current mirror circuits.

7. An integrated amplifier according to claim 6, wherein the reference bias current corresponds to a ratio between a base emitter junction voltage and a resistance of said integrated resistor.

8. An integrated amplifier according to claim 6, wherein each transistor of said first and second pair of bipolar junction transistors comprises an NPN transistor.

9. An integrated amplifier according to claim 6, wherein each transistor of said first and second current mirror circuits comprises a PNP transistor.

10. An integrated amplifier according to claim 6, wherein the integrated resistors for said first and second current mirror circuits are substantially equal.

11. An integrated amplifier according to claim 6, further comprising:
    a compensation network comprising
        a first resistor having a first terminal connected to a base terminal of one of said first pair of bipolar junction transistors of said input stage and having a second terminal connected to a common node connecting said second pair of bipolar junction transistors together of said output stage, and
        a second resistor connected between the first terminal of said first resistor and ground.

12. An method for forming a low voltage drop integrated amplifier, the method comprising the steps of:
    connecting a first pair of bipolar junction transistors together for forming a differential input stage;
    biasing the differential input stage with a reference bias current;
    driving a first and a second current mirror circuit by a respective transistor of the first pair of bipolar junction transistors, each of the first and second current mirror circuits comprising a transistor having a base terminal connected to an intermediate node;
    conducting the reference bias current of the differential input stage through an integrated resistor connected to the intermediate node, the integrated resistor in series with the respective transistor of the first pair of bipolar junction transistors; and controlling a second pair of bipolar junction transistors by a respective transistor of the first and second current mirror circuits, the second pair of bipolar junction transistors connected together to form an output stage.

13. A method according to claim 12, wherein the reference bias current corresponds to a ratio between a base emitter junction voltage and a resistance of the integrated resistor.

14. A method according to claim 12, wherein each transistor of the first and second pair of bipolar junction transistors comprises an NPN transistor.

15. A method according to claim 12, wherein each transistor of the first and second current mirror circuits comprises a PNP transistor.

16. A method according to claim 12, wherein the the integrated resistors for said first and second current mirror circuits are substantially equal.

* * * * *